United States Patent
Chen

(10) Patent No.: US 7,135,713 B2
(45) Date of Patent: Nov. 14, 2006

(54) LIGHT EMITTING DIODE AND METHOD FOR MANUFACTURING THE SAME

(75) Inventor: Shi-Ming Chen, Tainan (TW)

(73) Assignee: Epitech Technology Corporation, Taiwan (CN)

( * ) Notice: Subject to any disclaimer, the term of this patent is extended or adjusted under 35 U.S.C. 154(b) by 0 days.

(21) Appl. No.: 10/895,893

(22) Filed: Jul. 22, 2004

(65) Prior Publication Data

US 2005/0001226 A1 Jan. 6, 2005

Related U.S. Application Data

(62) Division of application No. 10/698,401, filed on Nov. 3, 2003, now abandoned.

(30) Foreign Application Priority Data

Jul. 3, 2003 (TW) .............................. 92118242 A

(51) Int. Cl.
*H01L 21/00* (2006.01)
*H01L 33/00* (2006.01)

(52) U.S. Cl. .......................... 257/98; 257/103; 438/25

(58) Field of Classification Search ...................... None
See application file for complete search history.

(56) References Cited

U.S. PATENT DOCUMENTS 5,753,933 A * 5/1998 Morimoto ..................... 257/14
6,462,358 B1 * 10/2002 Lin et al. ....................... 257/99
6,903,381 B1 * 6/2005 Lin et al. ....................... 257/99
2002/0158572 A1 * 10/2002 Chen et al. ................. 313/498
2003/0138015 A1 * 7/2003 Sato et al. .................... 372/45
2005/0001225 A1 * 1/2005 Yoshimura et al. .......... 257/98
2005/0017254 A1 * 1/2005 Lin et al. ....................... 257/81

FOREIGN PATENT DOCUMENTS

JP 8-172241 * 7/1996
JP 2001-44503 * 2/2001

OTHER PUBLICATIONS

Stringfellow et al., "High Brightness Light Emitting Diodes," pp. 195-197.*

* cited by examiner

*Primary Examiner*—Nathan J. Flynn
*Assistant Examiner*—Ahmed N. Sefer
(74) *Attorney, Agent, or Firm*—Baker & Hostetler LLP

(57) ABSTRACT

A light emitting diode and a method for manufacturing the same are disclosed. The light emitting diode comprises: a transparent substrate; a reflective layer located on a surface of the transparent substrate; a solder layer located on the other surface of the transparent substrate; a semiconductor epitaxial structure located on the solder layer, wherein the semiconductor epitaxial structure comprises a n-type contact layer, and the n-type contact layer can be a structure having a continuous flat surface, a structure having a continuous reticulate or bar surface, or a cylinder or prism structure having a discontinuous surface; and a transparent conductive layer located on the n-type contact layer of the semiconductor epitaxial structure.

7 Claims, 4 Drawing Sheets

US 7,135,713 B2

LIGHT EMITTING DIODE AND METHOD FOR MANUFACTURING THE SAME

PRIORITY CLAIM

This is a divisional application of prior application Ser. No. 10/698,401, filed on Nov. 3, 2003 now abandoned, entitled LIGHT EMITTING DIODE AND METHOD FOR MANUFACTURING THE SAME.

FIELD OF THE INVENTION

The present invention relates to a light emitting diode and a method for manufacturing the same, and more particularly, to a high-brightness light emitting diode manufactured by a wafer bonding technique.

BACKGROUND OF THE INVENTION

Referring to FIG. 1, FIG. 1 illustrates a cross-sectional view of a conventional light emitting diode. The light emitting diode comprises a substrate 100, a n-type semiconductor buffer layer 102, a n-type semiconductor contact layer 104, a n-type semiconductor cladding layer 106, an active layer 108, a p-type semiconductor cladding layer 110 and a p-type semiconductor contact layer 112 stacked in sequence. The light emitting diode further comprises a p-type contact pad 114 located on a portion of the p-type semiconductor contact layer 112, and a n-type contact pad 116 located on the exposed portion of the n-type semiconductor contact layer 104.

The material of the substrate 100 of a conventional light emitting diode adopts n-type gallium arsenide (GaAs). The substrate 100 composed of n-type GaAs can absorb light, so that most of the photons produced by the active layer 108 of the light emitting diode while emitting toward the substrate 100 are absorbed by the substrate 100, thus seriously affecting the light emitting efficiency of the light emitting diode device.

In order to avoid the issue of light absorbed by the substrate, I. Pollentirer et al. in the Gent university in Belgium disclosed a technology in the journal "Electronics Letters" about directly bonding the GaAs light emitting diode wafer to the silicon (Si) substrate after the GaAs light emitting diode wafer is stripped off the GaAs substrate in 1990. Additionally, the U.S. Pat. No. 5,376,580 (application date: Mar. 19, 1993) filed by Hewlett-Packard Co., U.S.A. disclosed a technology about directly bonding the AlGaAs light emitting diode wafer to the other substrate after the AlGaAs light emitting diode wafer is stripped off the GaAs substrate. However, the U.S. Pat. No. 5,376,580 has a disadvantage of low yield caused by the need of considering the consistency of the lattice direction between the bonding wafers. Furthermore, the U.S. Pat. No. 6,258,699 (application date: May 10, 1999) filed by K. H. Chang et al., Visual Photonics Epitaxy Co., R.O.C. disclosed a technology about using metal as a bonding agent after the light emitting diode wafer is stripped off the growth substrate. However, a disadvantage of the U.S. Pat. No. 6,258,699 is that: the light emitting diode wafer is easy to peel off after bonding, thus lowering the yield.

SUMMARY OF THE INVENTION

An objective of the present invention is to provide a light emitting diode having a transparent substrate, wherein a surface of the substrate having a reflective layer with high light reflection. Therefore, the loss of light absorbed by the substrate can be reduced, and the reuse of the photons can be provided, so as to increase the quantity of the photons extracted from lateral sides of the device.

Another objective of the present invention is to provide a light emitting diode, wherein a n-type contact pad of the light emitting diode is located on the -front side of the device, so that the light emitting diode has a better current-spreading effect.

Still another objective of the present invention is to provide a light emitting diode, and a transparent conductive layer can be formed to cover the n-type contact layer after etching, thereby increasing light extraction efficiency and keeping a better current-spreading effect.

Further another objective of the present invention is to provide a method for manufacturing a light emitting diode, by stripping off a growth substrate that absorbs light; and bonding a semiconductor epitaxial structure of the light emitting diode to a transparent substrate by using a solder material and a wafer bonding step, after the semiconductor epitaxial structure is completed. Therefore, the loss of light absorbed by the substrate can be reduced greatly, and the step of bonding wafer does not need to consider the direction and disposition of bonding wafer, thus increasing the yield and reducing the production cost.

According to the aforementioned objectives of the present invention, the present invention provides a light emitting diode comprising: a transparent substrate; a reflective layer located on a surface of the transparent substrate; a solder layer located on the other surface of the transparent substrate; a semiconductor epitaxial structure located on the solder layer; and a transparent conductive layer located on the semiconductor epitaxial structure.

According to a preferred embodiment of the present invention, the material of the reflective layer is metal, and the material of the solder layer is a conductive material or an insulating material that is heat-resistant and has a large thermal conductive coefficient, and the material of the solder layer can be organic material or metal.

According to the aforementioned objectives of the present invention, the present invention provides a method for manufacturing a light emitting diode, the method comprising: providing a growth substrate, wherein the growth substrate comprises a buffer layer and an etching stop layer stacked thereon in sequence; forming a semiconductor epitaxial structure located on the etching stop layer; removing the growth substrate, the buffer layer and the etching stop layer; providing a transparent substrate, wherein a surface of the transparent substrate comprises a reflective layer, and another surface of the transparent substrate comprises a solder layer; performing a wafer bonding step to bond the semiconductor epitaxial structure to the solder layer of the transparent substrate; and forming a transparent conductive layer to cover the semiconductor epitaxial structure.

According to a preferred embodiment of the present invention, after the wafer bonding step is performed, the method further comprises etching a n-type semiconductor contact layer of the semiconductor structure to make the n-type semiconductor contact layer form a non-planar continuous structure or a discontinuous surface structure, so as to enhance current-spreading effect.

The loss of light intensity resulted from the absorbing of the substrate can be reduced greatly by removing the growth substrate. Besides, the yield can be increased and the production cost can be reduced by using a solder material to perform a wafer bonding step. Furthermore, the reflective layer on the transparent substrate can provide reuse of photons to increase the quantity of the photons extracted from the lateral side of the device. In addition, depositing a transparent conductive layer on the etched n-type semiconductor contact layer not only can increase light extraction efficiency, but also can maintain current-spreading effect.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2 to FIG. 5a are schematic flow diagrams showing the process for manufacturing a light emitting diode in accordance with a preferred embodiment of the present invention.

DETAILED DESCRIPTION OF THE PREFERRED EMBODIMENT

The present invention discloses a light emitting diode and a method for manufacturing the same. In order to make the illustration of the present invention more explicitly and completely, the following description and the drawings from FIG. 2 to FIG. 6 are stated.

Among semiconductor light emitting devices, AlGaInP is a very commonly-used material. Because AlGaInP is a kind of direct bandgap materials, appropriately adjusting the ratio of In/(Al+Ga) in the AlGaInP material can make the lattice constant of the AlGaInP material and the GaAs substrate matched. Adjusting the ratio of Al and Ga in the AlGaInP material can make light emitted between 550 nm (green light) and 680 nm (red light) in wavelength. It is very easy to adjust the AlGaInP material on the device epitaxy, so it is easy to obtain emitting light with desired wavelengths by a linear method, and AlGaInP is very suitable for use in manufacturing a light emitting device of visible light zone.

Besides, adding the content of Al in AlGaInP material can increase the bandgap of the AlGaInP material, so that the AlGaInP material of high Al content is typically used as a cladding layer to confine carriers falling to a central illuminant layer (which is also called as an active layer), so as to enhance the injecting efficiency and radiation compound efficiency of the carriers and form a light emitting diode having a double heterostructure with high light emitting efficiency. The bandgap of the aforementioned cladding layer is larger than the energy of the emitting photons, so that the cladding layer does not absorb the light emitting from the active layer.

Figure 1:
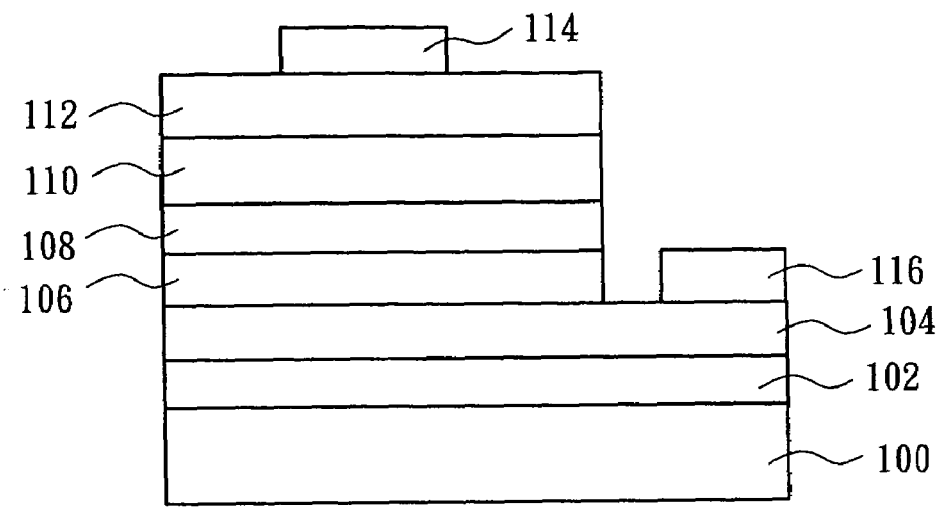
FIG. 1 illustrates a cross-sectional view of a conventional light emitting diode.
Figure 2:
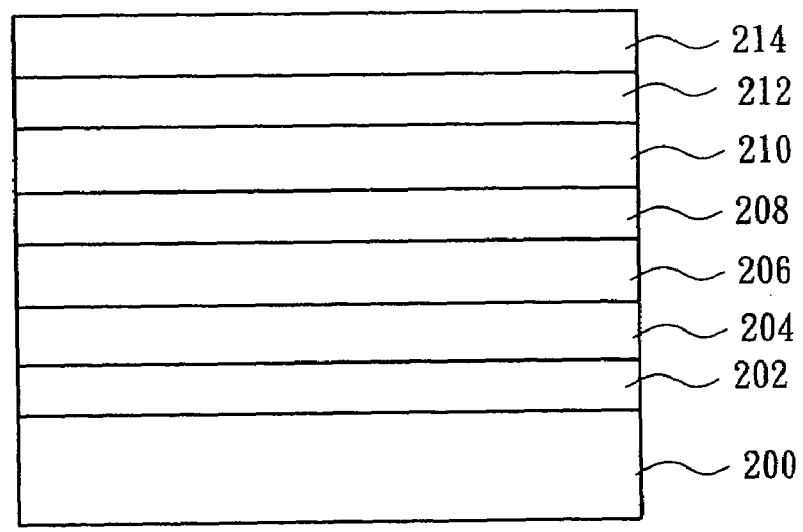

Referring to FIG. 2 and FIG. 5a, FIG. 2 to FIG. 5a are schematic flow diagrams showing the process for manufacturing a light emitting diode in accordance with a preferred embodiment of the present invention. In the manufacturing of the light emitting diode of the present invention, a substrate 200 is first provided, wherein the substrate 200 is a growth substrate, and the material of the substrate 200 can be such as n-type GaAs. A buffer layer 202 and an etching stop layer 204 are grown on the substrate 200 in sequence by using such as a metal organic chemical vapor deposition (MOCVD) method. Next, a semiconductor epitaxial structure of the light emitting diode is grown by using such as a metal organic chemical vapor deposition method, so as to grow in sequence a n-type semiconductor contact layer 206, a n-type semiconductor cladding layer 208, a multiple quantum well active layer 210, a p-type semiconductor cladding layer 212 and a p-type semiconductor contact layer 214 located on the etching stop layer 204 to form a structure such as shown in FIG. 2. In the preferred embodiment of the present invention, the material of the buffer layer 202 can be such as n-type GaAs; the material of the etching stop layer 204 can be such as n-type AlGaInP; the material of the n-type semiconductor contact layer 206 can be such as n-type GaAs; the material of the n-type semiconductor cladding layer 208 can be such as AlGaInP; the material of the multiple quantum well active layer 210 can be such as AlGaInP/GaInP; the material of the p-type semiconductor cladding layer 212 can be such as AlGaInP; and the material of the p-type semiconductor contact layer 214 can be such as AlGaInAsP.

Figure 3:
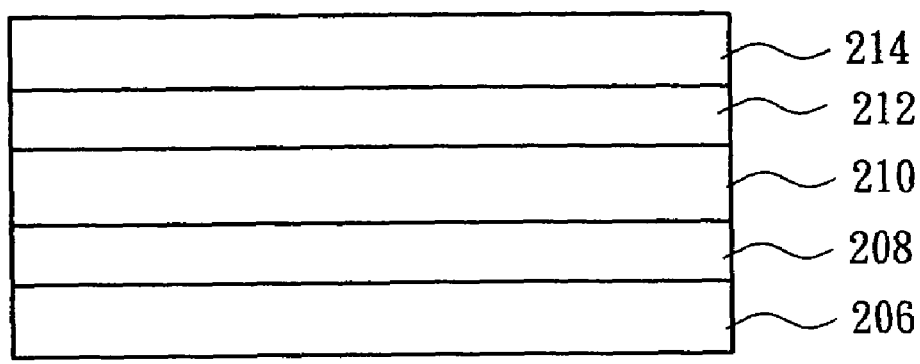

After the semiconductor epitaxial structure of the light emitting diode is completed, the etching stop layer 204 is removed by such as an etching method to remove the buffer layer 202 and the substrate 200 with remaining the epitaxial structure of the light emitting diode, such as shown in FIG. 3.

Figure 4:
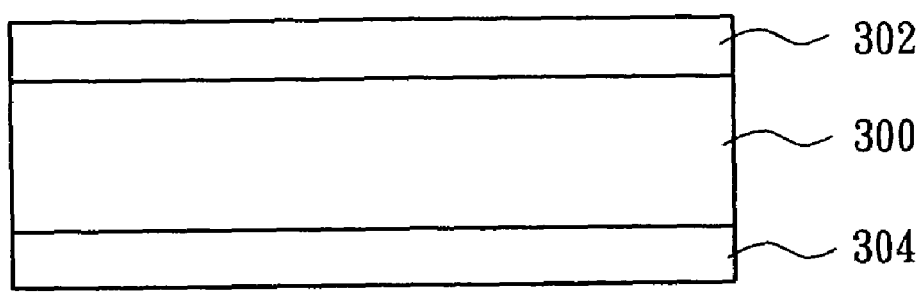

At this time, a transparent substrate 300 is provided, wherein the material of the transparent substrate 300 can be such as $Al_2O_3$, ZnSe, ZeO, GaP, or glass, etc. Then, a reflective layer 304 is formed on a surface of the transparent substrate 300 by using such as a deposition method, and a solder layer 302 is formed on the other surface of the transparent substrate 300 by using such as a coating method, a deposition method, or an evaporation method, so as to form a structure such as shown in FIG. 4. The material of the reflective layer 304 is preferably a metal of high light reflectivity, such as Al, Au, Ag, and alloy thereof, and the material of the solder layer 302 is an insulating material or an insulating material that is heat-resistant and has a large thermal conductive coefficient, such as organic material.

Subsequently, the epitaxial structure of the light emitting diode shown in FIG. 3 and the transparent substrate 300 shown in FIG. 4 are bonded together by using such as a wafer bonding technology to bond the solder layer 302 to the p-type semiconductor contact layer 214. It does not need to consider the direction and disposition of light emitting diode wafer desired to be bonded by using the solder layer 302 composed of the material that is heat-resistant and has a large thermal conductive coefficient to perform the wafer bonding step, so that the yield can be increased and the production cost can be reduced. Besides, after the transparent substrate 300 is used to replace the substrate 200, the loss of light absorbed by the substrate can be reduced effectively, and the light extraction efficiency of the light emitting diode can be increased. Furthermore, the reflective layer 304 of the transparent substrate 300 can provide reuse of photons produced by the multiple quantum well active layer 210, so as to increase the quantity of the photons extracted from the lateral side of the light emitting diode device.

After the wafer bonding of the light emitting diode is completed, a transparent conductive layer 216 is formed to cover the n-type semiconductor contact layer 206 by using such as an e-gun evaporation method, a thermal evaporation method, or a sputtering method, to increase the light extraction efficiency of the light emitting diode. The material of the transparent conductive layer 216 can be such as titanium (Ti), titanium alloy, titanium oxide or titanium nitride (such as TiN), tantalum (Ta) oxide (Such as $Ta_2O_5$) or tantalum nitride, platinum (Pt), platinum alloy, indium tin oxide (ITO), indium oxide, tin oxide, or cadmium tin oxide, etc.

Figure 5A:
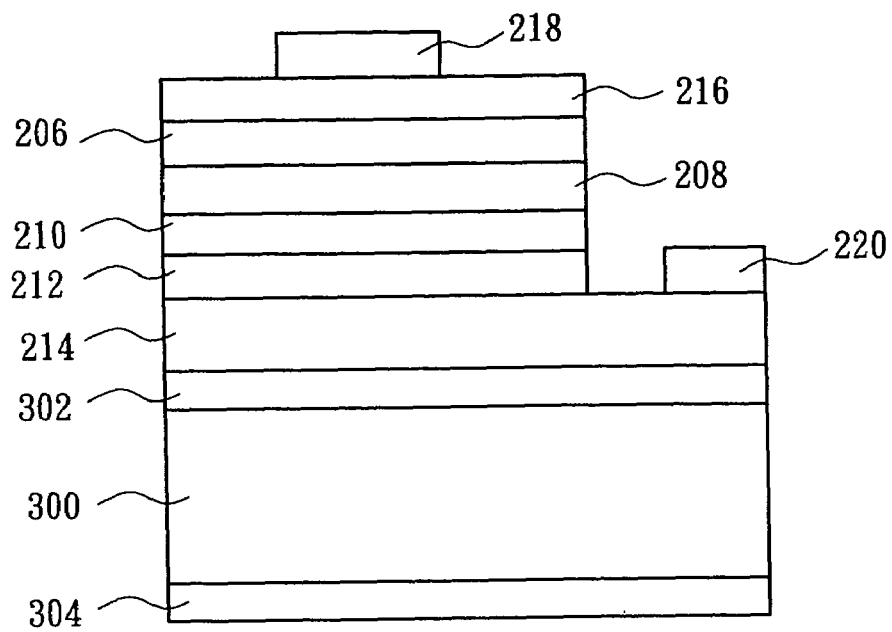

After the transparent conductive layer 216 is formed, a definition step is performed by using such as a photolithographic method and an etching method to remove a portion of the transparent conductive layer 216, a portion of the n-type semiconductor contact layer 206, a portion of the n-type semiconductor cladding layer 208, a portion of the multiple quantum well active layer 210 and a portion of the p-type semiconductor cladding layer 212, so as to expose a portion of the p-type semiconductor contact layer 214. Then, a n-type contact pad 218 is formed on a portion of the transparent conductive layer 216 and a p-type contact pad 220 is formed on the a portion of the exposed p-type semiconductor contact layer 214 respectively or simultaneously by using such as a definition technology comprising deposition, photolithography and etching, so as to complete the manufacturing of the light emitting diode, such as shown in FIG. 5a. Because the doping concentration of a n-type semiconductor is greater than that of the p-type semiconductor, the n-type contact pad 218 located on the front side of the light emitting diode can provide better current-spreading effect.

In order to achieve high light extraction efficiency and increase current-spreading effect, after the epitaxial structure of the light emitting diode shown in FIG. 3 and the transparent substrate 300 shown in FIG. 4 are bonded, the n-type semiconductor contact layer 222 can be firstly defined by using such as developing and dry etching or wet etching technology, so as to form the n-type semiconductor contact layer 222 having an uneven surface. The n-type semiconductor contact layer 222 can be etched to expose a portion of the n-type semiconductor cladding layer 208 or not to expose the n-type semiconductor cladding layer 208. In a preferred embodiment of the present invention, the n-type semiconductor contact layer 222 can be a cylinder or prism structure having a discontinuous surface, or a reticulate or bar structure having a continuous surface. Next, a transparent conductive layer 224 is formed to cover the n-type semiconductor contact layer 222 by using such as an e-gun evaporation method, a thermal evaporation method, or a sputtering method, wherein the material of the transparent conductive layer 224 can be such as titanium, titanium alloy, titanium oxide or titanium nitride, tantalum oxide or tantalum nitride, platinum, platinum alloy, indiun tin oxide, indium oxide, tin oxide, or cadmium tin oxide, etc. When the n-type semiconductor contact layer 222 exposes a portion of the n-type semiconductor cladding layer 208, the transparent conductive layer 224 covers the n-type semiconductor contact layer 222 and the exposed portion of the n-type semiconductor cladding layer 208; and when the n-type semiconductor contact layer 222 does not expose the n-type semiconductor cladding layer 208, the transparent conductive layer 224 only covers the n-type semiconductor contact layer 222.

Figure 5B:
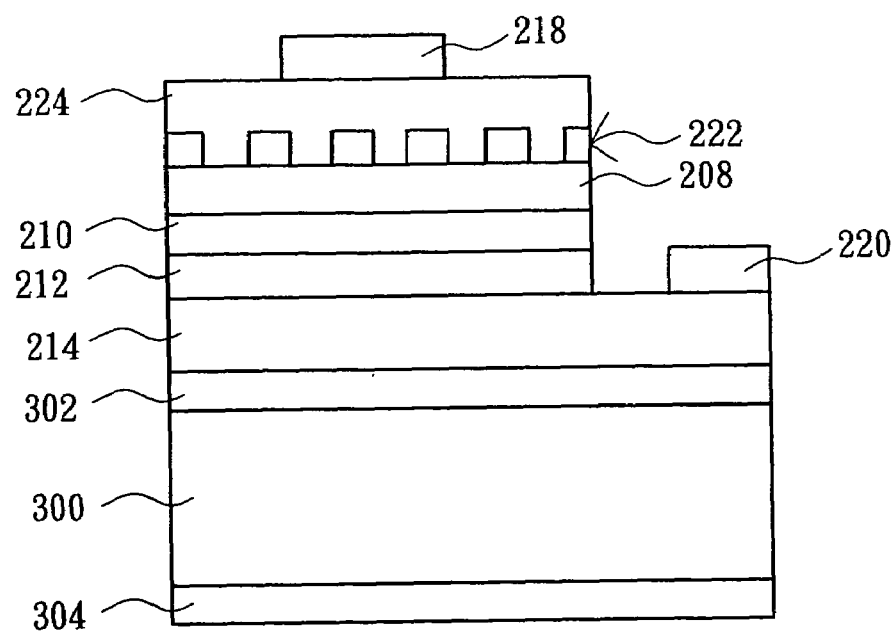
FIG. 5b illustrates a cross-sectional view of a light emitting diode in accordance with another preferred embodiment of the present invention.

Similarly, after the transparent conductive layer 224 is formed, a definition step is performed by using such as photolithographic and etching method to remove a portion of the transparent conductive layer 224, a portion of the n-type semiconductor contact layer 222, a portion of the n-type semiconductor cladding layer 208, a portion of the multiple quantum well active layer 210 and a portion of the p-type semiconductor cladding layer 212, so as to expose a portion of the p-type semiconductor contact layer 214. Then, a n-type contact pad 218 is formed on a portion of the transparent conductive layer 216 and a p-type contact pad 220 is formed on the a portion of the exposed p-type semiconductor contact layer 214 respectively or simultaneously by using such as a definition technology comprising deposition, photolithograph and etching, so as to complete the manufacturing of the light emitting diode, such as shown in FIG. 5b.

Figure 6:
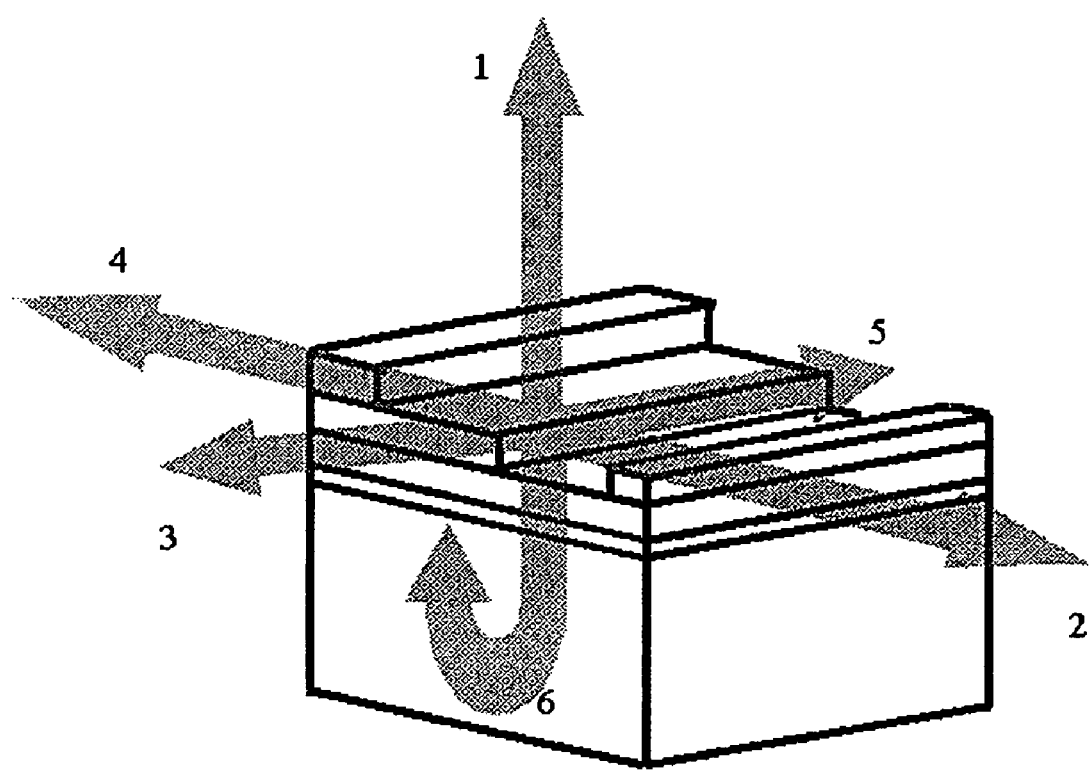
FIG. 6 illustrates a schematic diagram showing light extraction directions of a light emitting diode in accordance with a preferred embodiment of the present invention.

Referring to FIG. 6, FIG. 6 illustrates a schematic diagram showing light extraction directions of a light emitting diode in accordance with a preferred embodiment of the present invention. The light emitting diode of the present invention not only has a light extraction direction 1 as the conventional light emitting diode, but also has several newly-added light extraction direction 2, light extraction direction 3, light extraction direction 4, light extraction direction 5 and light extraction direction 6, so that high light output brightness can be obtained.

According to the aforementioned description, one advantage of the present invention is that: because the present invention uses a solder material that is heat-resistant and has a large thermal conductive coefficient to perform wafer bonding of a light emitting diode, and it does not need to consider the direction and disposition of bonding light emitting diode wafer, thereby increasing the yield and obtaining the objective of reducing the production cost.

According to the aforementioned description, the other advantage of the present invention is that: because the GaAs growth substrate is removed and the epitaxial structure of the light emitting diode is bonded on the transparent substrate, the loss of light resulted from the absorbing of the substrate can be reduced greatly, and light extraction efficiency can be increased.

According to the aforementioned description, still another advantage of the present invention is that: because a transparent conductive layer is deposited on the surface of the light emitting diode wafer after bonding, thereby increasing light extraction efficiency. In addition, depositing the transparent conductive layer on the n-type semiconductor contact layer after etching can provide high light extraction efficiency and obtain better current-spreading effect.

According to the aforementioned description, yet another advantage of the present invention is that: because the present invention forms a reflective layer on a side of the transparent substrate, the reuse of the photons can be provided and the quantity of the photons extracted from lateral sides of the light emitting diode device can be increased.

According to the aforementioned description, further another advantage of the present invention is that: because the n-type contact pad of the light emitting diode of the present invention is located on the front side of the device, the current-spreading effect of the light emitting diode of the present invention is better than that of a conventional light emitting diode whose p-type contact pad is located on the front side of the light emitting diode.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:
1. A light emitting diode, comprising:
a transparent substrate;
a reflective layer located on a surface of the transparent substrate;

a solder layer on the other surface of the transparent substrate;

a semiconductor epitaxial structure located on the solder layer;

a transparent conductive layer located on the semiconductor epitaxial structure, wherein the semiconductor epitaxial structure comprises a p-type semiconductor contact layer, a p-type semiconductor cladding layer, a multiple quantum well active layer, a n-type semiconductor cladding layer and a n-type semiconductor contact layer stacked in sequence, wherein the p-type semiconductor layer contacts the solder layer, and the transparent conductive layer covers the n-type semiconductor contact layer, wherein the material of the p-type semiconductor contact layer is AlGaInAsP;

the material of the p-type semiconductor cladding layer is AlGaInP;

the multiple quantum well active layer comprises an AlGaInP/GaInP structure;

the material of the n-type semiconductor cladding layer is AlGaInP; and the material of the n-type semiconductor contact layer is GaAs.

2. The light emitting diode according to claim 1, wherein the n-type semiconductor contact layer is a continuous surface structure.

3. The light emitting diode according to claim 1, wherein the n-type semiconductor contact layer is a discontinuous surface structure, and the discontinuous surface structure is selected from the group consisting a cylinder structure and an prism structure.

4. A light emitting diode, comprising:

a transparent substrate;

a reflective layer located on a surface of the transparent substrate;

a solder layer on the other surface of the transparent substrate;

a semiconductor epitaxial structure located on the solder layer, wherein the semiconductor epitaxial structure comprises:

a p-type semiconductor contact layer located on the solder layer, wherein the material of the p-type semiconductor contact layer is AlGaInAsP;

a p-type semiconductor cladding layer located on a portion of a surface of the p-type semiconductor contact layer, and the other portion of the surface of the p-type semiconductor contact layer is exposed, wherein the material of the p-type semiconductor cladding layer is AlGaInP;

a multiple quantum well active layer located on the p-type semiconductor cladding layer, wherein the multiple quantum well active layer comprises an AlGaInP/GaInP structure;

a n-type semiconductor cladding layer located on the multiple quantum well active layer, wherein the material of the n-type semiconductor cladding layer is AlGaInP; and a n-type semiconductor contact layer located on the n-type semiconductor cladding layer, wherein the material of the n-type semiconductor contact layer is GaAs; and a transparent conductive layer located on the n-type semiconductor contact layer.

5. The light emitting diode according to claim 4, wherein the n-type semiconductor contact layer is a continuous surface structure.

6. The light emitting diode according to claim 4, wherein the n-type semiconductor contact layer is a discontinuous surface structure, and the discontinuous surface structure is selected from the group consisting a cylinder structure and an prism structure.

7. The light emitting diode according to claim 4, further comprising a n-type contact pad on a portion of the transparent conductive layer and a p-type contact pad on the exposed portion of the surface of the p-type semiconductor contact layer.

* * * * *